United States Patent [19]

Lee

[11] Patent Number: 5,680,364

[45] Date of Patent: Oct. 21, 1997

[54] INTEGRATED CIRCUIT MEMORY DEVICE HAVING EQUALLY SPACED APART CELL ARRAYS

[75] Inventor: Jung-hyuck Lee, Seoul, Rep. of Korea

[73] Assignee: Samsung Electronics Co., Ltd., Suwon, Rep. of Korea

[21] Appl. No.: 638,998

[22] Filed: Apr. 24, 1996

[30] Foreign Application Priority Data

Apr. 24, 1995 [KR] Rep. of Korea .................. 95-9637

[51] Int. Cl.[6] .................................................. G11C 8/00
[52] U.S. Cl. ............................... 365/230.05; 365/185.2; 365/210; 365/230.03
[58] Field of Search ........................ 365/230.03, 230.04, 365/230.05, 210, 185.2

[56] References Cited

U.S. PATENT DOCUMENTS

| | | | |
|---|---|---|---|
| 5,018,100 | 5/1991 | Yanagisawa | 365/230.03 |
| 5,119,340 | 6/1992 | Slemmer | 365/230.03 |
| 5,228,132 | 7/1993 | Neal et al. | 395/425 |
| 5,247,484 | 9/1993 | Watanabe | 365/230.05 |

Primary Examiner—David C. Nelms
Assistant Examiner—Hien Nguyen
Attorney, Agent, or Firm—Bell, Seltzer, Park & Gibson

[57] ABSTRACT

An integrated circuit memory device includes a plurality of memory cell array blocks, each having M columns by N rows and arranged in linear, spaced apart relation in the integrated circuit to produce a row of memory cell array blocks. The row of memory cell array blocks includes first and second outer blocks and at least one inner block therebetween. Each of the outer blocks includes M/2 columns by N rows of dummy cells. Each common area between cell array blocks includes a common input/output circuit block having M/2 columns in each common area, a respective one of which is connected to M/2 columns by N rows of a respective adjacent pair of memory cell array blocks. The integrated circuit also includes input/output lines in each common area and a plurality of input/output circuit blocks, a respective one of which is connected to the input/output lines in a respective adjacent pair of common areas. Preferably, the plurality of memory cell array blocks comprises a plurality of triplets (i.e. integer multiples of three) of memory cell array blocks. A high density memory array structure is thereby provided.

24 Claims, 4 Drawing Sheets

INTEGRATED CIRCUIT MEMORY DEVICE HAVING EQUALLY SPACED APART CELL ARRAYS

FIELD OF THE INVENTION

This invention relates to memory devices and more particularly to integrated circuit memory devices.

BACKGROUND OF THE INVENTION

Integrated circuit memory devices, also referred to as chips, are widely used in electronic systems. For example, a read/write integrated circuit memory device, commonly referred to as a dynamic random access memory (DRAM), is widely used for program storage during program execution by a microprocessor or other central processing unit. In the current state of the art, more and more dynamic random access memory cells are being placed on a single integrated circuit, thereby providing high density, high speed DRAM chips.

As is well known to those having skill in the art, the integrated circuit memory device includes two primary portions: a cell array portion in which a plurality of memory cell array blocks are formed, and a peripheral circuit portion including control circuits for reading and writing data and for interfacing the memory cell array blocks with input/output terminals. As more and more memory cells are placed on a DRAM integrated circuit, the area of the integrated circuit which is occupied by the memory cell array blocks generally becomes larger. Accordingly, it is desirable to decrease the size of the memory cell array blocks in order to reduce the total manufacturing cost of the integrated circuit.

A fundamental technique for reducing the area of the memory cell array blocks is to shorten the bit line pitch. When the bit line pitch is shortened, it is important that the bit line sense amplifiers, column select gates and random access input/output circuits are also of small area, so that they can be placed on the chip within the shortened bit line pitch. The bit line pitch generally places a limit on the width of the bit line sense amplifier, the column select gates and the input/output circuitry of the integrated circuit memory device. Often, in order to accommodate a shortened bit line pitch, these elements are lengthened in the direction of the bit line.

In order to shorten the bit line pitch while still allowing for the appropriate placement of bit line sense amplifiers, column select gates and input/output circuits, a staggered structure of bit lines is often used. In the staggered structure, the bit lines of half the columns in a memory cell array block access the cell array block from one side such as the left side, and the bit lines of the other half of the cell array blocks access the cell array blocks from the other side, such as the right side. When this staggered bit line structure is used, the sense amplifiers, column select gates and input/output circuits corresponding to a bit line can then be disposed between two bit line pitches. Thus, the chip need not be lengthened in the bit direction to accommodate shortened pitch bit lines.

Triple port DRAMs are also known. A triple port DRAM generally includes first and second serial access memory blocks, first and second serial access input/output blocks, a bit mask register block, a bit mask register input/output block and a random access input/output block, for each bit line. Because of the large amounts of circuitry which must be crammed into the triple port design, staggered bit lines are generally used.

In such a staggered bit line structure, some of the adjacent cell array blocks use the same input/output line, while others use different input/output lines. When the same input/output line is used, a common input/output port circuit block can be used. When different input/output lines are used, each cell array block generally requires a separate input/output block. Accordingly, a triple port DRAM may greatly enlarge the integrated circuit area because of the complex input/output blocks.

FIGS. 1 and 2 are block diagrams illustrating a conventional DRAM including a triple port. FIGS. 1 and 2 will be used to explain the large integrated circuit area which may be required in a triple port DRAM.

Referring to FIG. 1, the integrated circuit memory device includes a cell array portion having eight cell array blocks (B0–B7). The eight cell array blocks are connected to four read/write control circuit blocks 20 via input/output lines 30.

Half the columns of each cell array block B0–B7 are connected to input/output blocks, referred to as herein as "SSAM" or "CSAM", on the left side of each cell array block B0–B7. The other half of the columns are connected to the input/output blocks SSAM or CSAM on the right side of each cell array block B0–B7. All columns within each cell array block B0–B7 use an identical input/output line 30. For example, the B0 block uses only an I/O 0 line and the B2 block uses only an I/O 1 line. A common input/output block (CSAM), for example 660 µm in width, is present between blocks using an identical I/O line, for example between blocks B0 and B1, B2 and B3, B4 and B5, and B6 and B7. In addition, two single input/output portions (SSAM) of 580 µm in width, are present between blocks using different I/O lines, for example between blocks B1 and B2, B3 and B4, and B5 and B6. The single input/output blocks SSAM and the common input/output blocks CSAM are connected to the read/write peripheral circuits 20 using input/output lines 30.

FIG. 2 illustrates a layout on an integrated circuit memory device of single input/output blocks SSAM between adjacent cell array blocks such as B1 and B2 using different input/output lines in a conventional 1 Meg DRAM having a triple port. As shown, the single input/output block SSAM is obtained by sequentially arranging an 80 µm sense amplifier SA, a 130 µm first serial access memory block SAM1, a 30 µm first serial access input/output block SAM 1 I/O, a 30 µm random access input/output block RAM I/O, a 30 µm bit mask register input/output block BMR I/O, a 120 µm bit mask register block BMR, a 130 µm second serial access memory block SAM2 and 30 µm second serial access input/output block SAM2.

As also shown in FIG. 2, the single input/output portion SSAM is connected at both ends to a 128K RAM core array block such as B1 and B2, each of which has a total length of 850 µm. Accordingly, the DRAM chip which includes eight cell array blocks, four common input/output portions and eight single input/output portions has the following width for the embodiment shown in FIG. 1:

$$850 \times 8 + 660 \times 4 + 580 \times 8 = 14,080 \, \mu m$$

Here, (850×8) denotes the total size of the 8 cell array blocks, each having a 850 µm width, (660×4) denotes the total size of the four common input/output portions (CSAM), each having a 660 µm width and (580×8) denotes the total size of the 8 single input/output portions (SSAM), each having a 580 µm width.

As shown in FIG. 1, in a conventional triple port DRAM, two single input/output portions (SSAM) are formed between the cell array blocks such as B1 and B2 using different input/output lines. This generally results in an increase in the chip size which produces high manufacturing costs and low yields and which may prevent higher integration of the integrated circuit memory device.

SUMMARY OF THE INVENTION

It is therefore an object of the present invention to provide an improved integrated circuit memory device.

It is another object of the present invention to provide an integrated circuit memory device having reduced integrated circuit area.

It is yet another object of the present invention to provide a triple port dynamic random access memory having reduced integrated circuit area.

These and other objects are provided, according to the present invention, by an integrated circuit memory device which includes a plurality of memory cell array blocks, each having M columns by N rows, and arranged in linear, spaced apart relation in the integrated circuit to produce a row of memory cell array blocks. The row of memory cell array blocks includes first and second outer blocks and at least one inner block therebetween. Each of the outer blocks includes M/2 columns by N rows of dummy cells. The M/2 columns by N rows of dummy cells include a plurality of bit lines which are maintained at a constant level.

The row of spaced apart memory cell array blocks define common areas in the integrated circuit between adjacent memory cell array blocks. Each common area includes a common input/output circuit block having M/2 columns in each common area, a respective one of which is connected to M/2 columns by N rows of a respective adjacent pair of memory cell array blocks. The integrated circuit also includes input/output lines in each common area and a plurality of input/output circuit blocks, a respective one of which is connected to the input/output lines in a respective adjacent pair of common areas.

Preferably, the plurality of memory cell array blocks comprises a plurality of triplets (i.e. integer multiples of three) of memory cell array blocks. Each triplet includes two outer triplet blocks and one center triplet block. A respective input/output circuit block is connected to M/2 columns of a respective outer triplet block and M columns of a respective center triplet block.

The integrated circuit memory device architecture described above allows the common areas in the integrated circuit between adjacent memory cell array blocks to have identical width. Moreover, each common area includes identical circuitry therein. Accordingly, a compact integrated circuit memory device is produced.

It will be understood that the aspects of the M/2 columns of dummy cells at the outer blocks, the triplets of memory cell array blocks and the equal spacing between adjacent memory cell array blocks may be used individually to improve the integration density of an integrated circuit memory device. These aspects are also preferably used in combination to provide an integrated circuit memory device having a high degree of integration.

Preferably, each of the identical common input/output circuit blocks which are identically placed between adjacent memory cell array blocks, includes a first sense amplifier and a first block select gate which is connected to M/2 columns of one cell array block. A first serial access memory block is located adjacent the first sense amplifier and block select gate. A first serial access input/output block is located adjacent the first serial access memory block. A random access input/output block is located adjacent the first serial access memory input/output block. A bit mask register input/output block is located adjacent the random access input/output block. A bit mask register is located adjacent the bit mask register input/output block. A second serial access memory block is located adjacent the bit mask register block. Finally, a second sense amplifier and block select gate is connected to M/2 columns of the other cell array block. A second serial access input/output block is interposed between the second amplifier block select gate and the second serial access memory block. Accordingly, by providing a common input/output circuit block, the width of the memory array is reduced in order to produce a higher level of integration.

DETAILED DESCRIPTION OF PREFERRED EMBODIMENTS

Figure 1:
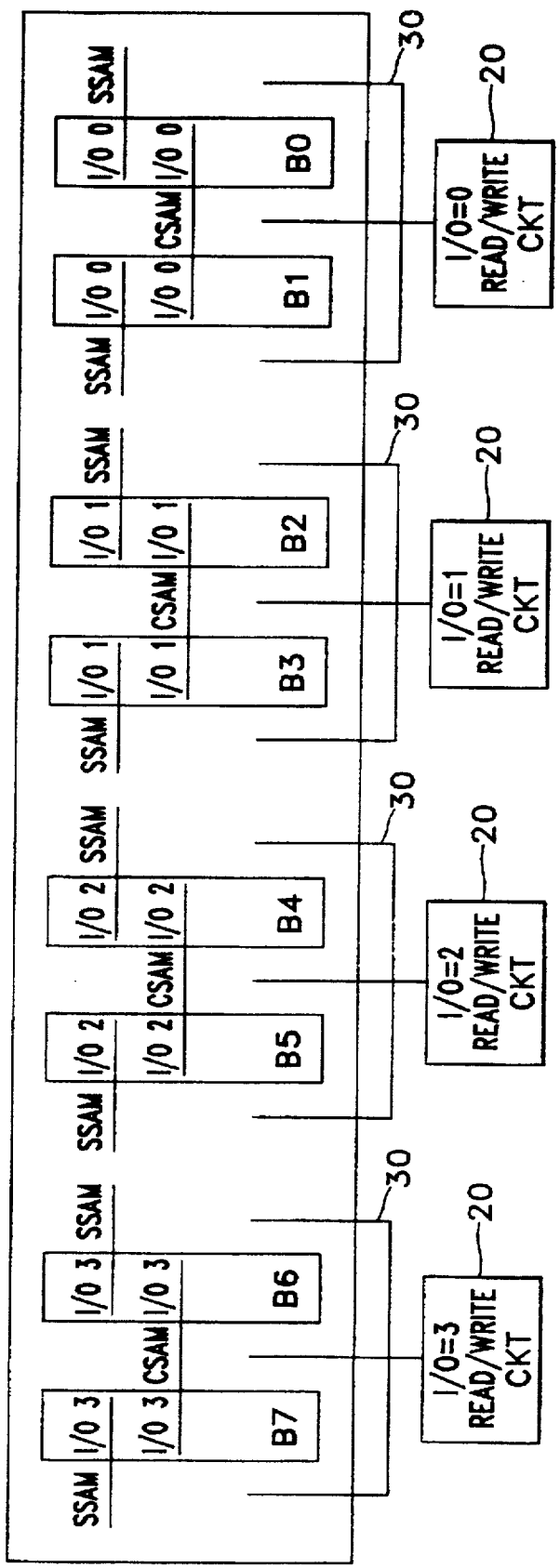
FIG. 1 is a block diagram illustrating a conventional triple port DRAM.
Figure 2:
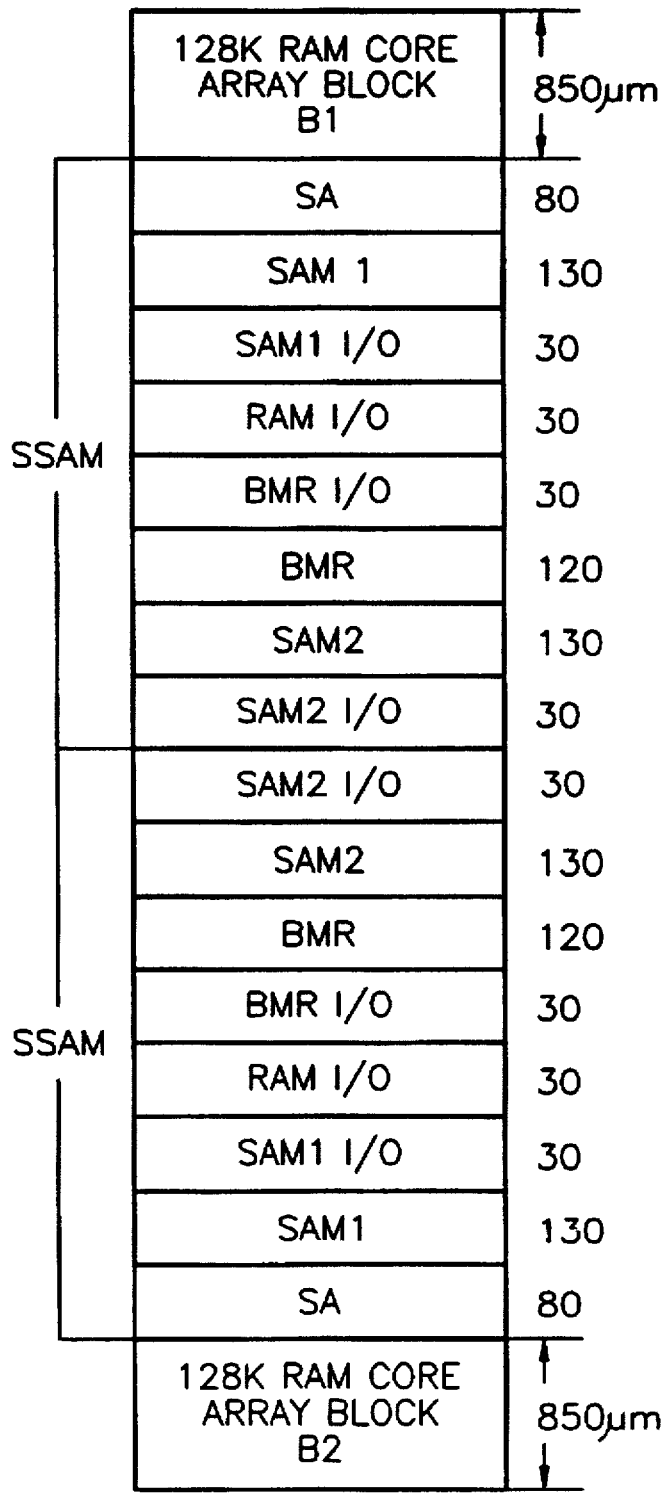
FIG. 2 is a detailed block diagram of a pair of memory cell array blocks and peripheral circuits therefor for the triple port DRAM of FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3:
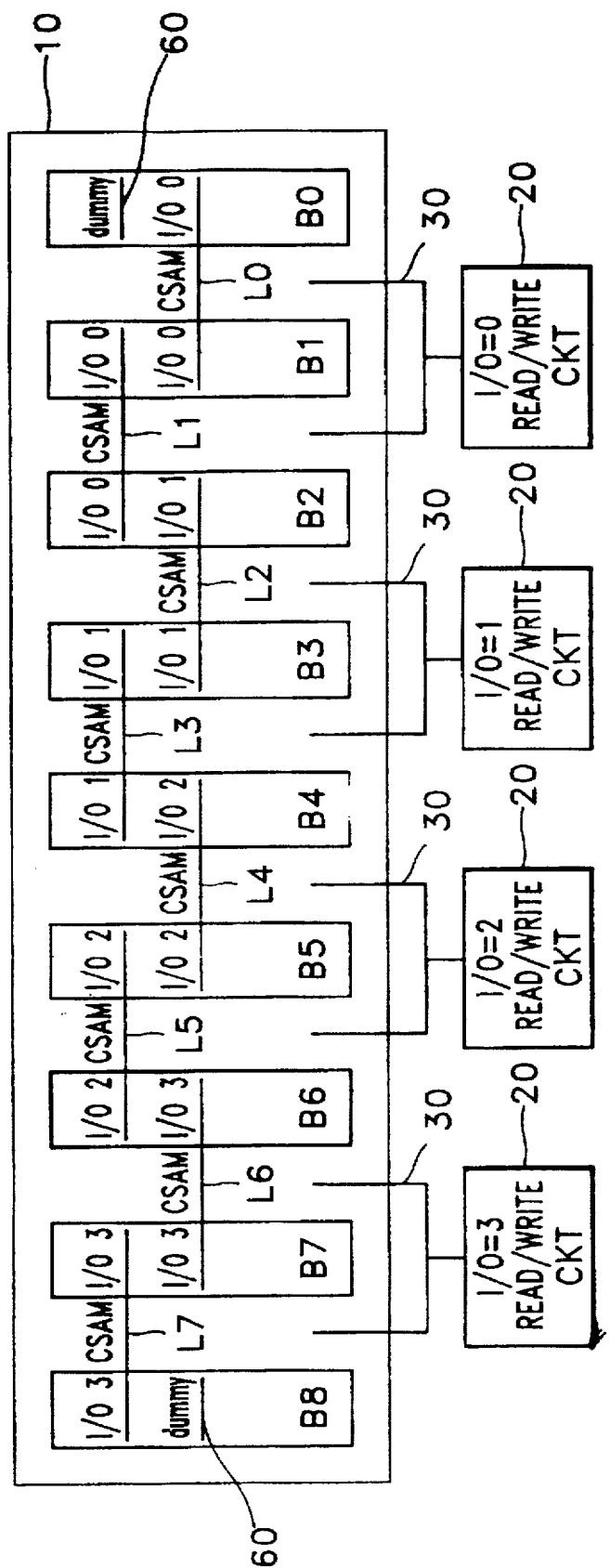
FIG. 3 is a block diagram of an integrated circuit triple port DRAM according to the present invention.

Referring now to FIG. 3, an integrated circuit memory device includes a cell array portion 10 including a plurality of memory cell array blocks B0–B8 of M columns by N rows each in spaced apart relation in the integrated circuit, to produce a row of memory cell array blocks. The row of blocks includes first and second outer blocks B0 and B8 and a plurality of inner blocks B1–B7 therebetween. Each of the outer blocks B0 and B8 includes M/2 columns by N rows of dummy cells 60. As also shown in FIG. 3, the row of spaced apart memory cell array blocks define common areas in the integrated circuit between adjacent memory cell blocks. The memory device further includes a common input/output circuit block CSAM having M/2 columns in each common area. Each common input/output circuit block CSAM is connected to M/2 columns by N rows of an adjacent pair of memory cell array blocks. Thus, for example, the common input/output circuit block (CSAM) L0 between memory cell array blocks B0 and B1 is connected to M/2 columns by N rows of memory cell array B0 and M/2 by N rows of memory cell array block B1.

The integrated circuit memory device also includes input/output lines 30 in each common area. A plurality of input/output circuit blocks 20, also referred to as read/write circuits, is connected to the input/output lines in an adjacent pair of common areas. Thus, the I/O=0 read/write circuit 20 is connected to the input/output circuit blocks CSAM L0 and L1 between memory cell array blocks B0 and B1, and B1 and B2, respectively.

Accordingly, the B0 memory cell array block includes cell arrays using the I/O 0 line and the dummy cell array 60. The B1 block includes cell arrays using only the I/O 0 line. The B2 block includes cell arrays using the I/O 0 and I/O 1 lines. The B3 block includes cell arrays using only the I/O 1 line. The B4 block includes cell arrays using the I/O 1 and the I/O 2 lines. The B5 block includes cell arrays using only the I/O 2 line. The B6 block includes cell arrays using the I/O 2 and the I/O 3 lines. The B7 block includes cell arrays using only the I/O 3 line, and the B8 block includes cell arrays using the I/O 3 line and the dummy cell array 60.

Thus, the cell arrays using the same I/O line (e.g., an I/O 0 line) are arranged in three adjacent cell array blocks (e.g., B0, B1 and B2). According to such an arrangement of the cell arrays, only one common input/output circuit block (CSAM) need be used between the cell array blocks.

It will be understood that the M/2 column bit lines of the first and second outer cell array blocks (B0 and B8) having M/2 columns×N rows of dummy cell arrays 60 are fixed at a bit line equalize level.

Accordingly, it may be seen that the plurality of memory cell array blocks B0–B8 include a plurality of triplets of memory cell array blocks. B0, (left half) B1 and B2 (right half) form a first triplet. B2 (left half) B3 and B4 (right half) form a second triplet. Each triplet includes two outer triplet blocks and one center triplet block. For example, in the first triplet, arrays B0 and B2 are outer triplet blocks and array B1 is a center triplet block. Each of the input/output circuit blocks is connected to M/2 columns of each outer triplet block and M columns of the center triplet block. Thus, for example, the input/output circuit block 30 for triplet B0, B1 and B2 is connected to M/2 columns of array B0 and B2 and M columns of array B1. It may also be seen from FIG. 3 that the common areas in the integrated circuit between adjacent memory cell array blocks each have identical widths, because they each use identical common input/output circuit blocks CSAM L0–L7. Thus, in contrast with the prior art, single input/output circuit blocks need not be used, and the variable spacing between adjacent memory cell array blocks need not be provided. A high density integrated circuit may thereby be provided.

Figure 4:
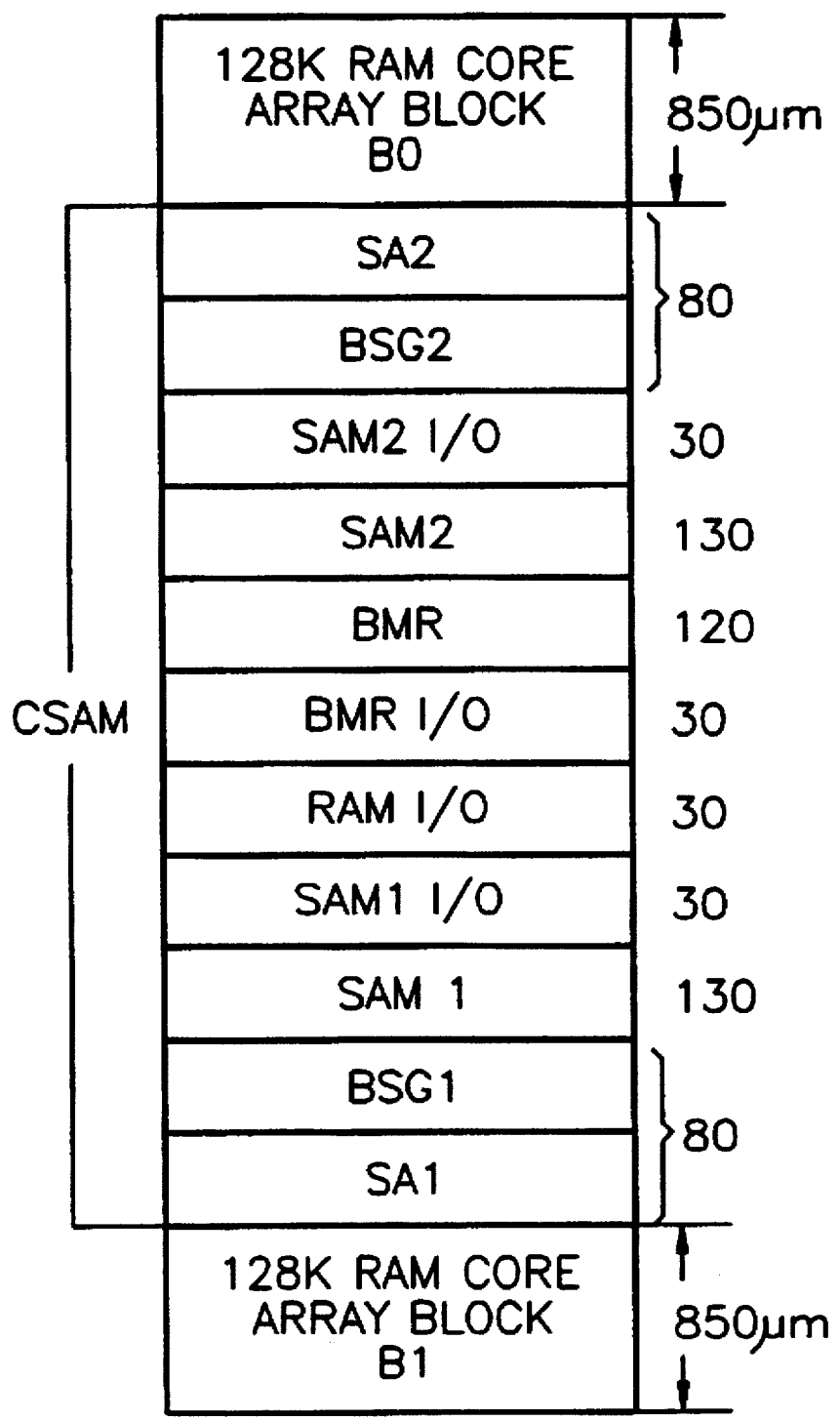
FIG. 4 is a detailed block diagram illustrating a pair of adjacent cell array blocks and the common input/output circuit blocks therebetween according to the present invention.

FIG. 4 illustrates a common input/output circuit block (CSAM). The common input/output circuit block (CSAM) includes a first sense amplifier/block select gate (SA1/BSG1) connected to M/2 columns of odd cell array blocks (B1, B3, B5 and B7) and a first serial access memory block (SAM1) adjacent the first sense amplifier/block select gate (SA1/BSG1). A first serial access I/O block (SAM1 I/O) is located adjacent the first serial access memory block (SAM1). A random access I/O block (RAM) I/O is located adjacent the first serial access I/O block (SAM1 I/O). A bit mask register I/O block (BMR I/O) is located adjacent the random access I/O block (RAM I/O). A bit mask register block (BMR) is located adjacent the bit mask register I/O block (BMR I/O). A second serial access memory block (SAM2) is located adjacent the bit mask register block (BMR). A second sense amplifier/block select gate (SA2/BSG2) is connected to M/2 columns of even cell array blocks (B0, B2, B4, B6 and B8) and a second serial access I/O block (SAM2 I/O) is interposed between the second sense amplifier/block select gate (SA2/BSG2) and the second serial access memory block (SAM2).

The selection of even memory cell array blocks (B0, B2, B4, B6, B8) or odd memory cell array blocks (B1, B3, B5,
B7) is determined by the Most Significant Bit of the ROW address signal (ROW-MSB). The selection of upper bit lines (L1, L3, L5 and L7) or lower bit lines (L0, L2, L4, L6) is determined by the Most Significant Bit of the Column address signal (COL-MSB).

Each selecting action according to the row and column address signals is summarized in the following table:

|  | ROW-MSB;L COL-MSB;L | ROW-MSB;L COL-MSB;H | ROW-MSB;H COL-MSB;L | ROW-MSB;H COL-MSB;H |
|---|---|---|---|---|
| selected block | B0,B2,B4,B6, B8 | B0,B2,B4,B6, B8 | B1,B3,B5,B7 | B1,B3,B5,B7 |
| selected bit line | L0,L2,L4,L6 | L1,L3,L5,L7 | L0,L2,L4,L6 | L1,L3,L5,L7 |

If the Most Significant Bit of the ROW address signal (ROW-MSB) is low, the even cell array blocks (B0, B2, B4, B6, B8) are selected, so that the first sense amplifier/block select gate (SA1/BSG1) connected thereto is opened, but the second sense amplifier/block select gate (SA2/BSG2) connected to the unselected odd cell array blocks (B1, B3, B5 and B7) is closed. Therefore, the even cell array blocks (B0, B2, B4, B6 and B8) are connected to the common input/output portion (CSAM).

Alternatively, if the Most Significant Bit of the ROW address signal (ROW-MSB) is high, the odd cell array blocks (B1, B3, B5, B7) are selected, so that the second sense amplifier/block select gate (SA2/BSG2) connected thereto is opened, and the first sense amplifier/block select gate (SA1/BSG1) connected to the unselected even cell array blocks (B0, B2, B4, B6 and B8) is closed. Therefore, the odd cell array blocks (B1, B3, B5, B7) are connected to the common input/output circuit block (CSAM).

According to the present invention, the total width of the memory cell array portion 10 including the 9 cell array blocks and the 8 common I/O portions therebetween is calculated as follows:

$$850 \times 9 + 660 \times 8 = 12,930 \ \mu m$$

A comparison of the cell array portion of a conventional triple port DRAM to that of the present invention is as follows:

$$14,080 - 12,930 = 1,150 \ \mu m$$

$$1,150/14,080 = 0.082$$

Therefore, the integrated circuit size can be reduced by 8.2%.

It will be understood that the above calculation is for a 1 meg DRAM. As integration becomes denser, the effect of the present invention may be even greater. For example, in case of a 2 meg DRAM, the integrated circuit can be reduced by about 11%.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit memory device comprising:
   a plurality of memory cell array blocks, each having M columns by N rows, and arranged in linear, spaced apart relation in said integrated circuit to produce a row of memory cell array blocks including first and second outer blocks and at least one inner block therebetween, each of said outer blocks including M/2 columns by N rows of dummy cells.

2. An integrated circuit memory device according to claim 1 wherein said row of spaced apart memory cell array blocks define common areas in said integrated circuit between adjacent memory cell array blocks, each common area having identical width, said memory device further comprising:

a common input/output circuit block in each common area, a respective one of which is connected to M/2 columns by N rows of a respective adjacent pair of memory cell array blocks.

3. An integrated circuit memory device according to claim 2 further comprising:

input/output lines in each common area; and a plurality of input/output circuit blocks, a respective one of which is connected to the input/output lines in a respective adjacent pair of common areas.

4. An integrated circuit memory device according to claim 3 wherein said plurality of memory cell array blocks comprises a plurality of triplets of memory cell array blocks, each triplet including two outer triplet blocks and one center triplet block, and wherein a respective one of said input/output circuit blocks is connected to M/2 columns of a respective two outer triplet blocks and M columns of a respective center triplet block.

5. An integrated circuit memory device according to claim 2 wherein each common area includes identical circuitry therein.

6. An integrated circuit memory device according to claim 2, wherein each of said common input/output circuit blocks comprises:

a first sense amplifier/block select gate connected to M/2 columns of one cell array block of an adjacent pair of said memory cell array blocks;

a first serial access memory block adjacent said first sense amplifier/block select gate portion;

a first serial access input/output block adjacent said first serial access memory block;

a random access input/output block adjacent said first serial access memory input/output block;

a bit mask register input/output block adjacent said random access input/output block;

a bit mask register block adjacent said bit mask register input/output block;

a second serial access memory block adjacent said bit mask register block;

a second sense amplifier/block select gate block connected to M/2 columns of the other cell array block of an adjacent pair of memory cell array blocks; and a second serial access input/output block between said second sense amplifier/block select gate and said second serial access memory block.

7. An integrated circuit memory device according to claim 1 wherein said M/2 columns by N rows of dummy cells include a plurality of bit lines which are maintained at a constant level.

8. An integrated circuit memory device according to claim 1 wherein said plurality of memory cell array blocks is an integer multiple of three memory blocks.

9. An integrated circuit memory device comprising:

a plurality of memory cell array blocks, each having M columns by N rows, and arranged in linear spaced apart relation in said integrated circuit to produce a row of memory cell array blocks, wherein said plurality of memory blocks is an integer multiple of three, and wherein said row of memory cell array blocks includes first and second outer blocks and at least one inner block therebetween, each of said outer blocks including M/2 columns by N rows of dummy cells.

10. An integrated circuit memory device according to claim 9 wherein said row of spaced apart memory cell array blocks define common areas in said integrated circuit between adjacent memory cell array blocks, said memory device further comprising:

a common input/output circuit block in each common area, a respective one of which is connected to M/2 columns by N rows of a respective adjacent pair of memory cell array blocks.

11. An integrated circuit memory device according to claim 10 further comprising:

input/output lines in each common area; and a plurality of input/output circuit blocks, a respective one of which is connected to the input/output lines in a respective adjacent pair of common areas.

12. An integrated circuit memory device according to claim 11 wherein said plurality of memory cell array blocks comprises a plurality of triplets of memory cell array blocks, each triplet including two outer triplet blocks and one center triplet block, and wherein each of said input/output circuit blocks is connected to M/2 columns of a respective two outer triplet blocks and M columns of a respective triplet center block.

13. An integrated circuit memory device according to claim 10, wherein each of said common input/output circuit blocks comprises:

a first sense amplifier/block select gate connected to M/2 columns of one cell array block of an adjacent pair of said memory cell array blocks;

a first serial access memory block adjacent said first sense amplifier/block select gate portion;

a first serial access input/output block adjacent said first serial access memory block;

a random access input/output block adjacent said first serial access memory input/output block;

a bit mask register input/output block adjacent said random access input/output block;

a bit mask register block adjacent said bit mask register input/output block;

a second serial access memory block adjacent said bit mask register block;

a second sense amplifier/block select gate block connected to M/2 columns of the other cell array block of an adjacent pair of memory cell array blocks; and a second serial access input/output block between said second sense amplifier/block select gate and said second serial access memory block.

14. An integrated circuit memory device according to claim 10 wherein said M/2 columns by N rows of dummy cells include a plurality of bit lines which are maintained at a constant level.

15. An integrated circuit memory device according to claim 9 wherein said row of spaced apart memory cell array blocks define common areas in said integrated circuit between adjacent memory cell array blocks, each common area having identical width.

16. An integrated circuit memory device according to claim 15 wherein each common area includes identical circuitry therein.

17. An integrated circuit memory device comprising:

a plurality of memory cell array blocks, each having M columns by N rows, and arranged in linear, equally spaced apart relation in said integrated circuit to produce a row of memory cell array blocks, wherein said row of memory cell array blocks includes first and second outer blocks and at least one inner block therebetween, each of said outer blocks including M/2 columns by N rows of dummy cells.

18. An integrated circuit memory device according to claim 17 wherein said row of equally spaced apart data blocks define a common area in said integrated circuit between adjacent memory cell array blocks, said memory device further comprising:

a common input/output circuit block in each common area, a respective one of which is connected to M/2 columns by N rows of a respective adjacent pair of memory cell array blocks.

19. An integrated circuit memory device according to claim 18 further comprising:

input/output lines in each common area; and a plurality of input/output circuit blocks, a respective one of which is connected to the input/output lines in a respective adjacent pair of common areas.

20. An integrated circuit memory device according to claim 19 wherein said plurality of memory cell array blocks comprises a plurality of triplets of memory cell array blocks, each triplet including two outer triplet blocks and one center triplet block, and wherein a respective one of said input/output circuit blocks is connected to M/2 columns of a respective two outer triplet blocks and M columns of a respective triplet center block.

21. An integrated circuit memory device according to claim 18, wherein said common input/output circuit block comprises:

a first sense amplifier/block select gate connected to M/2 columns of one cell array block of an adjacent pair of said memory cell array blocks;

a first serial access memory block adjacent said first sense amplifier/block select gate portion;

a first serial access input/output block adjacent said first serial access memory block;

a random access input/output block adjacent said first serial access memory input/output block;

a bit mask register input/output block adjacent said random access input/output block;

a bit mask register block adjacent said bit mask register input/output block;

a second serial access memory block adjacent said bit mask register block;

a second sense amplifier/block select gate block connected to M/2 columns of the other cell array block of an adjacent pair of memory cell array blocks; and a second serial access input/output block between said second sense amplifier/block select gate and said second serial access memory block.

22. An integrated circuit memory device according to claim 17 wherein said M/2 columns by N rows of dummy cells include a plurality of bit lines which are maintained at a constant level.

23. An integrated circuit memory device according to claim 22 wherein said plurality of memory cell array blocks is an integer multiple of three memory blocks.

24. An integrated circuit memory device according to claim 17 wherein each common area includes identical circuitry therein.

* * * * *